US009252263B1

(12) United States Patent
Vielemeyer et al.

(10) Patent No.: US 9,252,263 B1

(45) Date of Patent: Feb. 2, 2016

(54) MULTIPLE SEMICONDUCTOR DEVICE TRENCHES PER CELL PITCH

(71) Applicant: Infineon Technologies Austria AG, Villach (AT)

(72) Inventors: Martin Vielemeyer, Villach (AT); Michael Hutzler, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/447,864

(22) Filed: Jul. 31, 2014

(51) Int. Cl.
*H01L 29/78* (2006.01)
*H01L 29/40* (2006.01)

(52) U.S. Cl.
CPC .......... *H01L 29/7813* (2013.01); *H01L 29/407* (2013.01)

(58) Field of Classification Search
CPC ............ H01L 29/407; H01L 29/66727; H01L 29/66734; H01L 29/7397; H01L 29/7813; H01L 29/0696; H01L 29/41766; H01L 29/4236; H01L 29/42368
See application file for complete search history.

(56) References Cited

U.S. PATENT DOCUMENTS 8,247,865 B2 8/2012 Hirler
2007/0108511 A1* 5/2007 Hirler .......................... 257/328

FOREIGN PATENT DOCUMENTS

DE 102005052734 A1 4/2007

* cited by examiner

*Primary Examiner* — Roy Potter
*Assistant Examiner* — Paul Patton
(74) *Attorney, Agent, or Firm* — Murphy, Bilak & Homiller, PLLC

(57) ABSTRACT

A semiconductor device includes a plurality of field plate trenches formed in a semiconductor substrate, a plurality of gate trenches formed in the semiconductor substrate and spaced apart from the field plate trenches, and a plurality of device cells having a cell pitch defined by a distance from one side of a field plate trench to the same side of an adjacent field plate trench. Each device cell includes a first doped region of a first conductivity type and a second doped region of a second conductivity type adjacent the first doped region in a part of the semiconductor substrate disposed between the adjacent field plate trenches that define the cell pitch. At least some of the device cells have more than one gate trench per cell pitch.

26 Claims, 7 Drawing Sheets

P 114 104 106 122 202 101 118 118 110 110 112 112 102 102 124 $D_{FP}$

MULTIPLE SEMICONDUCTOR DEVICE TRENCHES PER CELL PITCH

TECHNICAL FIELD

The present application relates to semiconductor devices, in particular semiconductor devices with low channel resistance.

BACKGROUND

Power MOSFETs (metal oxide semiconductor field effect transistors) have high switching speeds and require very little gate drive power because of the insulated gate. One drawback of power MOSFETs is on-resistance (Rdson) and its strong positive temperature coefficient. To achieve a high efficiency power MOSFET, Rdson*A must be reduced where the parameter 'A' represents device area. The main components of Rdson include the channel, accumulation layer, drift region, and parasitics (e.g. metallization, bond wires, package, etc.). Reduced Rdson*A is particularly important at low switching frequencies, where static losses dominate over dynamic losses.

In some applications such as automotive applications, power MOSFETs can switch too fast which causes problems. To mitigate these problems, Qgsth must be increased where Qgsth is the gate-source charge measured from 0V to the threshold voltage. In conventional solutions, increasing Qgd also increases the ratio Qgd/Qgsth where Qgsth is the gate charge in weak inversion. Increasing the ratio Qgd/Qgsth can cause capacitive turn-on and highly increased losses. Furthermore, due to overly high Qrr (reverse recovery charge) stored e.g. in the border of the die (chip), power MOSFETs are not sufficiently commutation-robust in some applications. Also, conventional power MOSFETs cause high losses because of high forward voltage in forward conduction mode. Accordingly, there is a need to reduce the channel resistance (Rchannel) in order to increase Qgd without significantly changing the ratio Qgd/Qgsth or increasing the risk of capacitive turn-on.

SUMMARY

According to an embodiment of a semiconductor device, the semiconductor device comprises a plurality of field plate trenches formed in a semiconductor substrate, a plurality of gate trenches formed in the semiconductor substrate and spaced apart from the field plate trenches, and a plurality of device cells having a cell pitch defined by a distance from one side of a field plate trench to the same side of an adjacent field plate trench. Each device cell comprises a first doped region of a first conductivity type and a second doped region of a second conductivity type adjacent the first doped region in a part of the semiconductor substrate disposed between the adjacent field plate trenches that define the cell pitch. At least some of the device cells have more than one gate trench per cell pitch.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein relate to semiconductor devices such as, but not limited to, power MOSFETs and diodes. In the context of the present specification, the term "MOSFET" should be understood as including the more general term "MISFET" (metal-insulator-semiconductor FET). For example, the term MOSFET should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

The embodiments described herein reduce channel resistance (Rchannel) per area (Rchannel*A) of a semiconductor device by offering more channel length per area. This way, the overall Rdson*A of the device decreases. The embodiments described herein provide flexibly in reducing Rchannel*A by adding more gate trenches per cell pitch to increase Qgd as needed. This way, the switching speed of the device can be tuned. Also, the ratio Qgd/Qgsth is not significantly changed and the risk of capacitive turn-on is not increased. The forward voltage and Qrr of the device can be reduced by parallelizing a power MOSFET by using a low-threshold voltage MOSFET that acts like a diode (a so-called MOS-gate diode or MGD for short). The semiconductor mesa in which the MGD is located can also have a gate trench.

Figure 1:
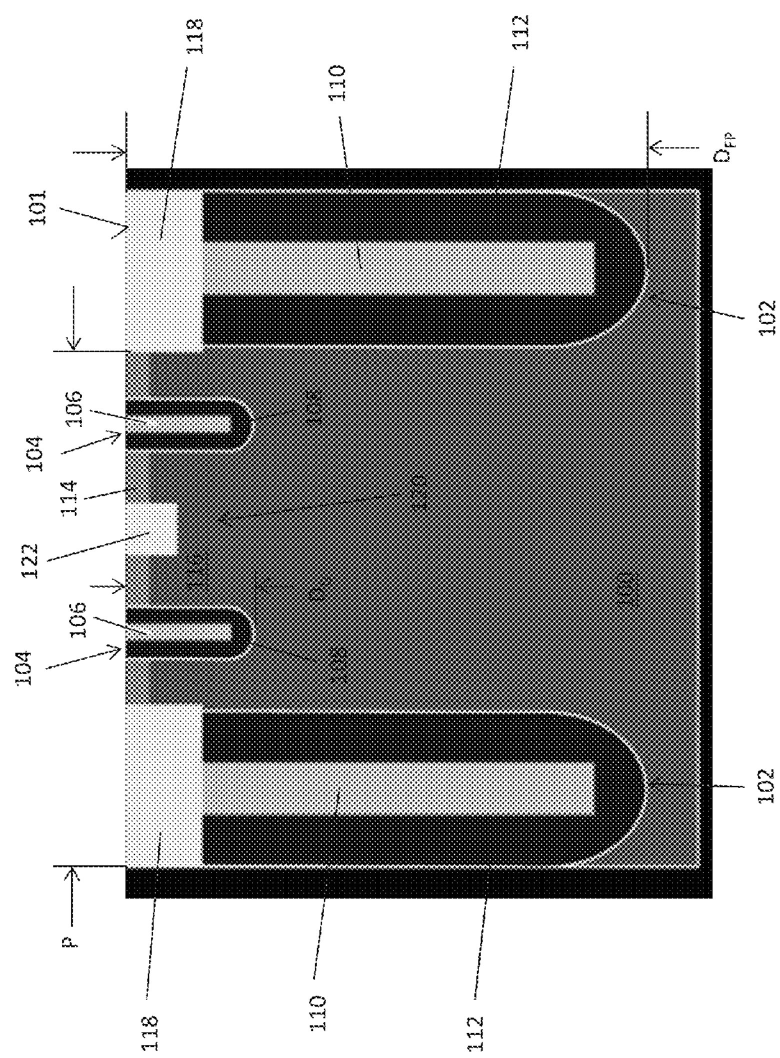
FIG. 1 illustrates a cross-sectional view of an embodiment of a semiconductor device with multiple gate trenches per cell pitch.
Figure 2:
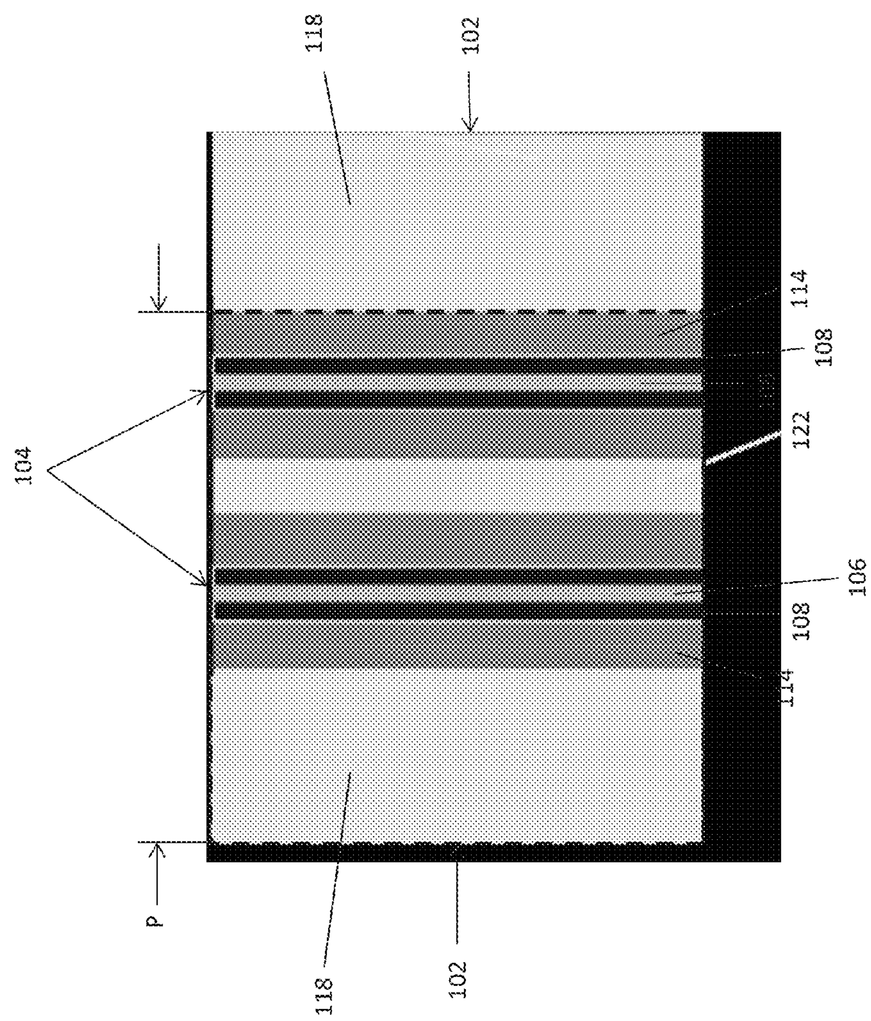
FIG. 2 illustrates a top plan view of an embodiment of a semiconductor device with multiple strip-shaped gate trenches per cell pitch.

FIG. 1 illustrates a cross-sectional view of an embodiment of a semiconductor device having reduced Rchannel*A by adding more gate trenches per cell pitch, and FIG. 2 shows a corresponding top plan view. The semiconductor device includes a semiconductor substrate 100, a plurality of field plate trenches 102 formed in the semiconductor substrate 100 and a plurality of gate trenches 104 formed in the semiconductor substrate 100 and spaced apart from the field plate trenches 102. The field plate trenches 102 extend from a first main surface 101 of the semiconductor substrate 100 to a depth ($D_{FP}$) within the substrate 100. The gate trenches 104 extend from the first main surface 101 of the semiconductor substrate 100 to a depth ($D_G$) within the substrate 100 where $D_{FP} \neq D_G$. Typically, $D_{FP} >> D_G$. The trench depths $D_{FP}$ and/or $D_G$ can vary over the semiconductor substrate 100 e.g. between cell field and edge termination trenches. In each case, gate conductors 106 are disposed in the gate trenches 104 and insulated from the surrounding semiconductor material by a gate dielectric 108. Field plates 110 are disposed in the field plate trenches 102 and insulated from the surrounding semiconductor material by a field plate dielectric 112. As such, the field plates 110 are disposed in different trenches 102 than the gate conductors 106. According to the embodiment shown in FIG. 2, the field plate trenches 102 extend in strips along a direction parallel to the first main surface 101 of the semiconductor substrate 100. That is, the field plate trenches 102 are long, narrow trenches according to this embodiment.

The semiconductor device includes a plurality of active device cells having a cell pitch (P) i.e. spacing defined by a distance from one side of a field plate trench 102 to the same side of an adjacent field plate trench 102. One device cell is shown in FIGS. 1 and 2 for ease of illustration, which is illustrated as a dashed box in FIG. 2. The device cells collectively form an active part (e.g. transistor, diode, etc.) of the semiconductor device and repeat at intervals corresponding to the cell pitch. The semiconductor device can also include non-active parts such as edge termination structures, etc. which are not shown in FIG. 1 for ease of illustration.

Each device cell includes a first doped region 114 of a first conductivity type and a second doped region 116 of a second conductivity type adjacent the first doped region 114 in a part of the semiconductor substrate 100 disposed between the adjacent field plate trenches 102 that define the cell pitch. A conductor 118 such as polysilicon, metal or a doped semiconductor region disposed in the upper portion of the field plate trenches 102 contacts the adjacent first and second doped regions 114, 116 so that the field plates 102 are at approximately the same potential as the first and second doped regions 114, 116. Any standard gate conductors, field plates and dielectrics can be used.

In the case of a transistor device such as a MOSFET, the first doped region 114 is a transistor source region and the second doped region 116 is a transistor body region. At least some of the device cells have more than one gate trench 104 per cell pitch as shown in FIG. 1. That is, at least some of the device cells have more than one gate trench 104 interposed between the adjacent field plate trenches 102 that define the cell pitch of those device cells. By providing more than one gate trench 104 per cell pitch, the semiconductor device has more channel length per area which reduces Rchannel*A and thus reduces Rdson*A.

In some embodiments, at least some of the device cells that have more than one gate trench 104 per cell pitch can include only a single type of gate trench 104 that comprises the gate conductor 106 disposed in a gate trench 104 and electrically insulated from the first and second doped regions 114, 116 of the device cell by the gate dielectric 108 e.g. as shown in FIG. 1. If more than one external gate connection is needed for the semiconductor device, the gate trenches 104 in the device cells can be connected to different gate pads (out of view) to yield homogenous current flow. For example, in FIG. 1 the device cell has two gate trenches 104. Each gate trench 104 in the device cell can be connected to a different gate pad or to the same gate pad depending on the type of device.

In some embodiments e.g. as shown in FIG. 2, the gate trenches 104 extend in a strip-like manner in parallel with the field plate trenches 102. As a result, a mesa 120 of semiconductor material is interposed between the strip-like gate trenches 104 of the device cells that have more than one gate trench 104 per cell pitch. For these device cells, a contact 122 can be formed between the gate trenches 104 for electrically contacting the mesa 120 of semiconductor material e.g. the body in the case of a transistor device. This way, the channel remains useful in the mesa 120 between the gate trenches 104. Any standard contact can be used e.g. such as a highly doped region of the semiconductor mesa.

Figure 3:
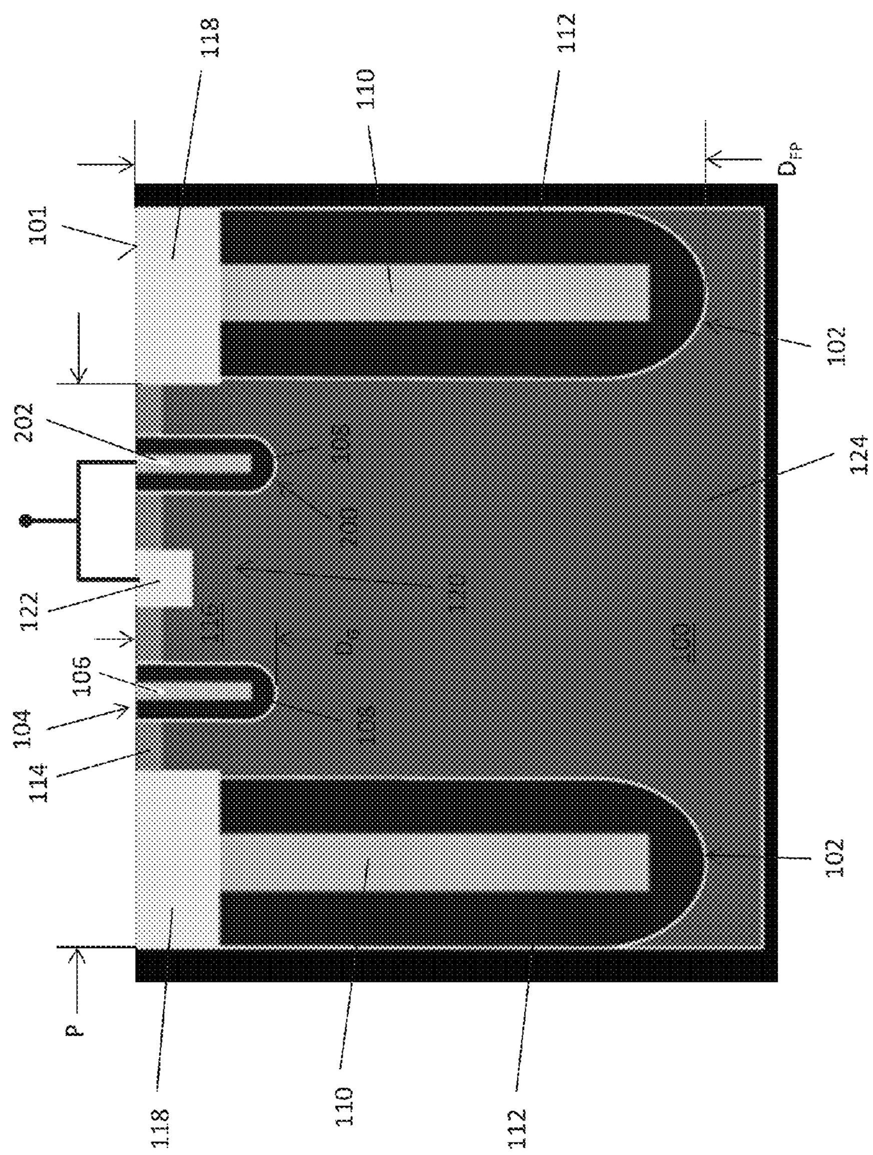
FIG. 3 illustrates a cross-sectional view of another embodiment of a semiconductor device with multiple gate trenches per cell pitch.

FIG. 3 illustrates a cross-sectional view of another embodiment of a semiconductor device having reduced Rchannel*A by adding more gate trenches per cell pitch. The embodiment shown in FIG. 3 is similar to the embodiment shown in FIG. 1. However, at least some of the device cells that have more than one gate trench 104 per cell pitch include a first type of gate trench 104 and a second type of gate trench 200. The first type of gate trench 104 comprises a gate conductor 106 disposed in a gate trench 104 and electrically insulated from the first and second doped regions 114, 116 of the device cell by a gate dielectric 108. The first type of gate trench 104 is a standard MOSFET transistor gate structure. The second type of gate trench 200 comprises a gate conductor 202 disposed in a gate trench 200 and electrically connected to the first and second doped regions 114, 116 of the device cell as schematically illustrated in FIG. 3. The second type of gate trench 200 is a MOS-gated diode (MGD) structure. One structural characteristic of a MGD is that the gate 202 is connected to the source 114. For example, the MGD gate 202 can be short-circuited to the source-poly of an FET. The gate 202 of the MGD trench 200 generates a conducting channel in the body region 116 between the underlying drift region 124 and the source region 114 each time the electrical potential of the drift region 124 is more than the threshold voltage of the MGD above the electrical potential of the source and body regions 114, 116. The threshold voltage of the MGD is lower than the forward voltage of the inherent body diode (not shown), so that the MGD bypasses the body diode before the body diode is forward biased. Also possibly different than the embodiment of FIG. 1, the device in FIG. 3 can have a significantly thinner gate dielectric 108 or other geometric difference so that the MGD trench 200 is not deactivated when connected to the source 114.

In some embodiments, at least some of the device cells that have more than one gate trench per cell pitch include only the MGD gate trench type that comprises a gate conductor 202 disposed in a gate trench 200 and electrically connected to the first and second doped regions 114, 116 of the device cell e.g. as shown in FIG. 3. The remaining device cells that have more than one gate trench per cell pitch can include only the standard transistor gate trench type that comprises a gate conductor 106 disposed in a gate trench 104 and electrically insulated from the first and second doped regions 114, 116 of the device cell e.g. as shown in FIG. 1. For example, 20% or less of the device cells that have more than one gate trench per cell pitch can include only the MGD gate trench type shown in FIG. 3 and the other 80% or more of the device cells that have more than one gate trench per cell pitch can include only the standard transistor gate trench type shown in FIG. 1. In yet other embodiments, at least some of the device cells that have more than one gate trench per cell pitch can include both the MGD and standard transistor gate trench types. In the case of a diode device, all of the device cells that have more than one gate trench per cell pitch include only the MGD type of gate trenches.

Figure 4:
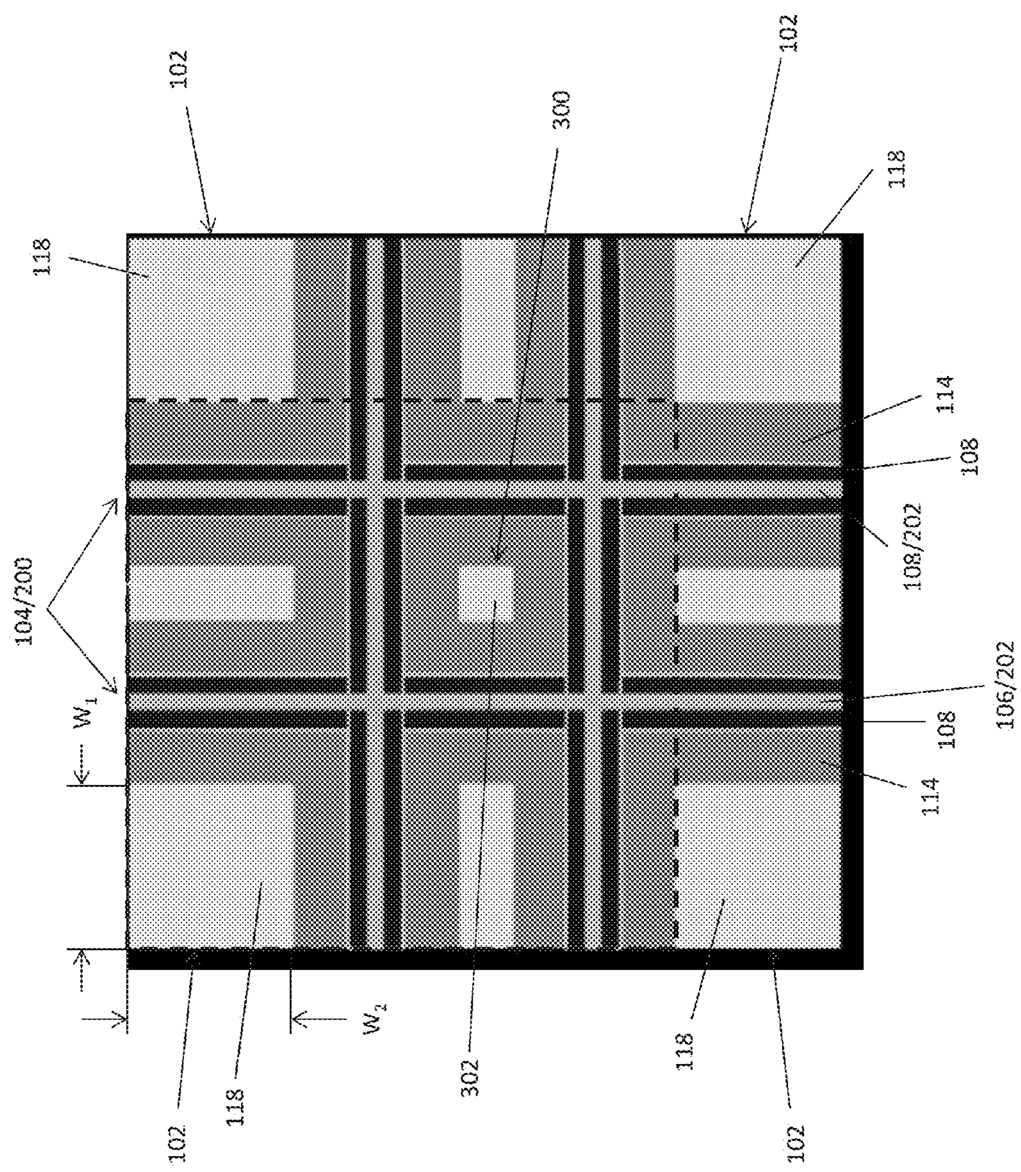
FIG. 4 illustrates a top plan view of an embodiment of a semiconductor device with multiple needle/columnar-shaped gate trenches per cell pitch.

FIG. 4 illustrates a top plan view of another embodiment of the semiconductor devices shown in FIGS. 1 and 3. According to this embodiment, the field plate trenches 102 have an extension ($W_1$, $W_2$) in every direction in parallel to the first main surface 101 of the semiconductor substrate 100, which is smaller than the maximum extension (depth) $D_{FP}$ e.g. as shown FIG. 1 in the direction perpendicular to the first main surface 101. The field plate trenches 102 thus have a needle or columnar shape over the depth $D_{FP}$ of the trenches 102 and do not extend in continuous strips along a direction parallel to the first main surface 101 of the semiconductor substrate 100 according to this embodiment. Examples of such needle/columnar-shaped field plate trenches are disclosed in co-owned U.S. patent application Ser. No. 11/543,732, filed Oct. 5, 2006, the content of said application incorporated herein by reference in its entirety.

At least two of the gate trenches 104/200 of the device cells that have more than one gate trench per cell pitch intersect within the same device cell according to the embodiment shown in FIG. 4. One device cell is illustrated in FIG. 4 as a dashed box. According to this embodiment, a portion of the second doped region 116 is segmented into islands 300 by the intersecting gate trenches 104/200. A contact 302 can be provided for electrically contacting the islands 300 of the second doped region 116 e.g. in regions where the islands 300 are wider such as on the diagonal between the needle/columnar-shaped field plate trenches 102. By providing contacts 302 to the islands 300 of the second doped region 116 formed by the intersecting gate trenches 104/200, the channel remains useful in the island regions 300 within the device cells. Any standard contact can be used e.g. such as a highly doped region of the semiconductor mesa.

The first and second doped regions 114, 116 of the device cells are also contacted by the conductor 118 disposed in the upper portion of the needle/columnar-shaped field plate trenches 102 as previously described herein and as shown in FIGS. 1 and 3. For example in the case of a MOSFET device, the first doped region 114 is a transistor source region and the second doped region 116 is a transistor body region. The body region 116 of the device cells that have more than one gate trench per cell pitch is electrically contacted within the device cells through the field plates 110 in the needle/columnar-shaped field plate trenches 102 and also through the body contacts 302 to the islands of the second doped region 116 formed by the intersecting gate trenches 104/200. Each device cell that has more than one gate trench per cell pitch can include only an MGD gate trench type e.g. as shown in FIG. 3, only a standard transistor gate trench type e.g. as shown in FIG. 1 or both types of gate trenches.

Figure 5:
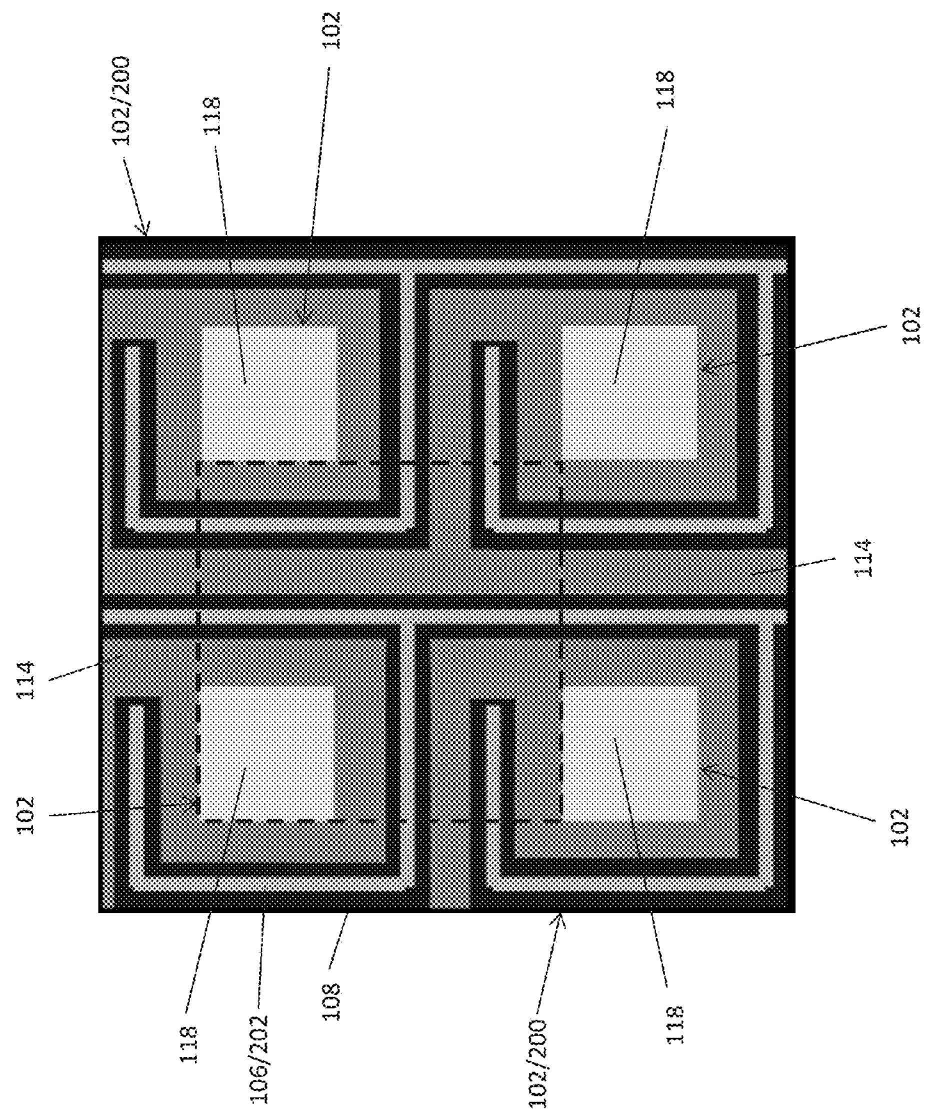
FIG. 5 illustrates a top plan view of another embodiment of a semiconductor device with multiple needle/columnar-shaped gate trenches per cell pitch.

FIG. 5 illustrates a top plan view of yet another embodiment of the semiconductor devices shown in FIGS. 1 and 3. The embodiment shown in FIG. 5 is similar to the embodiment of FIG. 4 in that the field plate trenches 102 have a needle/columnar shape. However, the gate trenches 104/200 of the device cells (one of which is illustrated with a dashed box) that have more than one gate trench per cell pitch are non-intersecting within the same device cell according to this embodiment. As such, the first and second doped regions 114, 116 extend continuously within each device cell to the end of the device cell without interruption by the gate trenches 104/200. That is, the gate trenches 104/200 do not completely surround the needle/columnar-shape field plate trenches 102 so that the first and second doped regions 114, 116 between the gate trenches 104/200 remain connected. This way, the first and second doped regions 114, 116 can be connected to the same potential over the entire device cell.

Further according to this embodiment, the second doped region 116 of the device cells that have more than one gate trench per cell pitch is electrically contacted within the device cells only through the field plates 110 in the needle/columnar-shaped field plate trenches 102 as previously described herein and as shown in FIGS. 1 and 3. For example in the case of a MOSFET device, the first doped region 114 of the device cells is a transistor source region and the second doped region 116 of the device cells is a transistor body region. The body region 116 of the device cells that have more than one gate trench per cell pitch is electrically contacted within the device cells only through the field plates 110 in the needle/columnar-shaped field plate trenches 102. The additional island (body) contacts 302 shown in FIG. 4 can be omitted by using the gate trench configuration shown in FIG. 5, decreasing cell size. Each device cell that has more than one gate trench per cell pitch can include only an MGD gate trench type e.g. as shown in FIG. 3, only a standard transistor gate trench type e.g. as shown in FIG. 1 or both types of gate trenches. The continuous vertical gate trenches 104/200 in each device cell can be connected to the same or separate gate pads (out of view) depending upon the type of semiconductor device.

Figure 6:
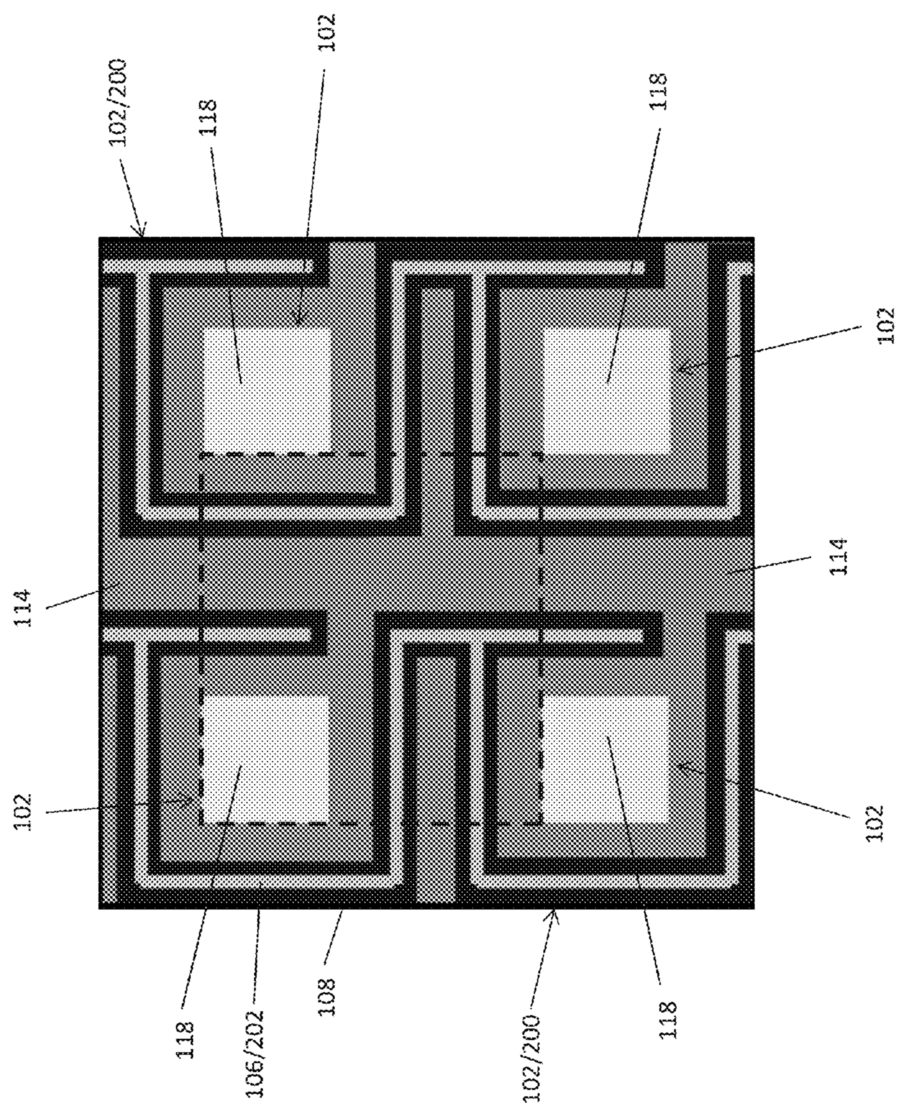
FIG. 6 illustrates a top plan view of yet another embodiment of a semiconductor device with multiple needle/columnar-shaped gate trenches per cell pitch.

FIG. 6 illustrates a top plan view of still another embodiment of the semiconductor devices shown in FIGS. 1 and 3. The embodiment shown in FIG. 6 is similar to the embodiment of FIG. 5 in that the field plate trenches 102 have a needle/columnar shape and the gate trenches 104/200 of the device cells that have more than one gate trench per cell pitch are non-intersecting within the same device cell (one of which is illustrated with a dashed box). Only the gate trench layouts are different between the embodiments of FIGS. 5 and 6.

Figure 7:
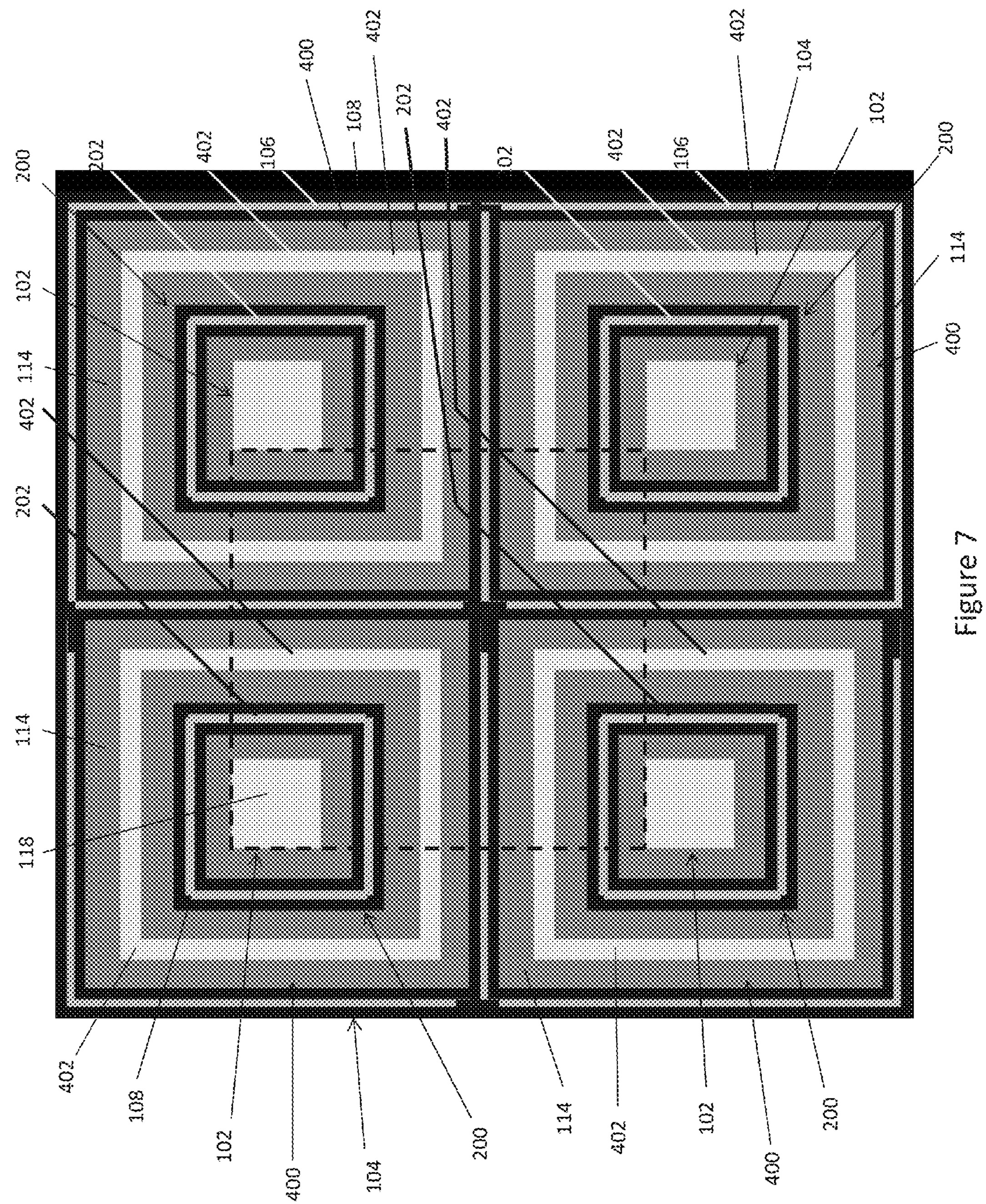
FIG. 7 illustrates a top plan view of still another embodiment of a semiconductor device with multiple needle/columnar-shaped gate trenches per cell pitch.

FIG. 7 illustrates a top plan view of another embodiment of the semiconductor devices shown in FIGS. 1 and 3. The embodiment shown in FIG. 7 is similar to the embodiments of FIGS. 5 and 6 in that the field plate trenches 102 have a needle/columnar shape. However, each MGD gate trench 200 e.g. as shown in FIG. 3 forms an inner ring around one of the needle/columnar-shaped field plate trenches 102 and each standard transistor gate trench 104 e.g. as shown in FIG. 1 forms an outer ring around one of the MGD gate trenches 200 so that an intermediary ring 400 of the first and second doped regions 114, 116 is interposed between the inner and outer trench rings 200, 104. One or both of the trench rings 200, 104 can be closed (i.e. completely surrounding the second doped region) or open (i.e. partly surrounding the second doped region e.g. U-shaped, etc.). A contact 402 such as a highly doped region can be provided for electrically contacting the intermediary ring of the first and second doped regions 114, 116. If the inner ring formed by gate trenches 200 is an MGD with a poly-electrode gate conductor 202 connected to the source 114, the MGD gate conductor 202 can be used for providing a mesa contact instead of contact 402.

In the embodiments previously described herein, at least some of the device cells have more than one gate trench per cell pitch. In each case, the gate trenches can have the same or different geometry within the same device cell. For example, one of the gate trenches can be wider than the other gate trench(s) and therefore have lower gate resistance. One of the gate trenches can extend deeper ($D_G$) into the semiconductor substrate than the other gate trench(s) and therefore have lower threshold voltage (in a certain range) and higher Qgd (gate-to-drain capacitance). One of the gate trenches can have a thinner, thicker or different gate dielectric material than the other gate trench(s) and therefore have a different threshold voltage, sub-threshold slope and gate charges. One of the gate trenches can have a different gate conductor material than the other gate trench(s) and therefore have a different gate resistance. One of the gate trenches can have a deeper gate recess than the other gate trench(s) and therefore have higher gate resistance, lower Qgs, and higher threshold voltage (in a certain range). One of the gate trenches can have a thicker bottom oxide than the other gate trench(s) and therefore have a higher gate resistance and lower Qgd. Some gate trenches can be optimized and others not optimized. For example if a low gate resistance is necessary and all the gate trenches are connected, one gate trench can be widened, a metal included, etc. to provide the desired low gate resistance. If the other gate trenches are connected to the optimized ones often enough, all the current can run through the optimized gate trenches and e.g. only the last μm through the non-optimized gate trenches. As such, every portion of the gate is low ohmic connected to the gate pad. With such variations, the characteristics of the different gate trenches can be tuned as required by the application.

Spatially relative terms such as “under”, “below”, “lower”, “over”, “upper” and the like, are used for ease of description to explain the positioning of one element relative to a second element. These terms are intended to encompass different orientations of the device in addition to different orientations than those depicted in the figures. Further, terms such as “first”, “second”, and the like, are also used to describe various elements, regions, sections, etc. and are also not intended to be limiting. Like terms refer to like elements throughout the description.

As used herein, the terms “having”, “containing”, “including”, “comprising” and the like are open ended terms that indicate the presence of stated elements or features, but do not preclude additional elements or features. The articles “a”, “an” and “the” are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:

a plurality of field plate trenches formed in a semiconductor substrate;

a plurality of gate trenches formed in the semiconductor substrate and spaced apart from the field plate trenches; and a plurality of device cells having a cell pitch defined by a distance from one side of a field plate trench to the same side of an adjacent field plate trench, each device cell comprising a first doped region of a first conductivity type and a second doped region of a second conductivity type adjacent the first doped region in a part of the semiconductor substrate disposed between the adjacent field plate trenches that define the cell pitch, wherein at least some of the device cells have more than one gate trench per cell pitch, wherein at least some of the device cells that have more than one gate trench per cell pitch include only a single type of gate trench that comprises a gate conductor disposed in a gate trench.

2. The semiconductor device of claim 1, wherein at least some of the device cells that have more than one gate trench per cell pitch include a first type of gate trench and a second type of gate trench, wherein the first type of gate trench comprises a gate conductor disposed in a gate trench and electrically insulated from the first and second doped regions of the device cell, and wherein the second type of gate trench comprises a gate conductor disposed in a gate trench and electrically connected to the first and second doped regions of the device cell.

3. The semiconductor device of claim 2, wherein the gate trenches of the first type have a different geometry than the gate trenches of the second type within the same device cell.

4. The semiconductor device of claim 1, wherein the gate conductor of each device cell that includes only a single type of gate trench is electrically insulated from the first and second doped regions of the device cell.

5. The semiconductor device of claim 1, wherein the gate conductor of each device cell that includes only a single type of gate trench is electrically connected to the first and second doped regions of the device cell.

6. The semiconductor device of claim 1, wherein all of the device cells that have more than one gate trench per cell pitch include only a single type of gate trench that comprises a gate conductor disposed in a gate trench and electrically connected to the first and second doped regions of the device cell.

7. The semiconductor device of claim 1, wherein the field plate trenches extend in strips along a direction parallel to a first main surface of the semiconductor substrate.

8. The semiconductor device of claim 7, wherein the first doped region of the device cells is a transistor source region, wherein the second doped region of the device cells is a transistor body region, and wherein the device cells that have more than one gate trench per cell pitch further comprise a contact disposed between the gate trenches for electrically contacting the transistor body region.

9. The semiconductor device of claim 1, wherein the field plate trenches have an extension in every direction in parallel to a first main surface of the semiconductor substrate, which is smaller than a maximum extension in a direction perpendicular to the first main surface.

10. The semiconductor device of claim 9, wherein the first doped region of the device cells is a transistor source region, wherein the second doped region of the device cells is a transistor body region, and wherein the body region of the device cells that have more than one gate trench per cell pitch is electrically contacted within the device cells only through a field plate in the field plate trenches.

11. The semiconductor device of claim 9, wherein at least two of the gate trenches of the device cells that have more than one gate trench per cell pitch intersect within the same device cell.

12. The semiconductor device of claim 11, wherein a portion of the second doped region is segmented into islands by the intersecting gate trenches, and wherein the device cells that have more than one gate trench per cell pitch further comprise a contact for electrically contacting the islands of the second doped region.

13. The semiconductor device of claim 9, wherein the gate trenches of the device cells that have more than one gate trench per cell pitch are non-intersecting within the same device cell so that the second doped region extends continuously within each device cell to the end of the device cell without interruption by the gate trenches.

14. The semiconductor device of claim 13, wherein the second doped region of the device cells that have more than one gate trench per cell pitch is electrically contacted within the device cells only through a field plate in the field plate trenches.

15. The semiconductor device of claim 9, wherein at least some of the device cells that have more than one gate trench per cell pitch include a first type of gate trench and a second type of gate trench, wherein the first type of gate trench comprises a gate conductor disposed in a gate trench and electrically insulated from the first and second doped regions of the device cell, and wherein the second type of gate trench comprises a gate conductor disposed in a gate trench and electrically connected to the first and second doped regions of the device cell.

16. The semiconductor device of claim 15, wherein the gate trenches of the first type have a different geometry than the gate trenches of the second type within the same device cell.

17. The semiconductor device of claim 9, wherein at least some of the device cells that have more than one gate trench per cell pitch include only a single type of gate trench that comprises a gate conductor disposed in a gate trench and electrically insulated from the first and second doped regions of the device cell.

18. The semiconductor device of claim 9, wherein at least some of the device cells that have more than one gate trench per cell pitch include only a single type of gate trench that comprises a gate conductor disposed in a gate trench and electrically connected to the first and second doped regions of the device cell.

19. The semiconductor device of claim 9, wherein all of the device cells that have more than one gate trench per cell pitch include only a single type of gate trench that comprises a gate conductor disposed in a gate trench and electrically connected to the first and second doped regions of the device cell.

20. The semiconductor device of claim 9, wherein a first type of the gate trenches comprises a gate conductor disposed in a gate trench and electrically insulated from the first and second doped regions of the device cell, wherein a second type of the gate trenches comprises a gate conductor disposed in a gate trench and electrically connected to the first and second doped regions of the device cell, wherein each gate trench of the second type forms an inner ring around one of the field plate trenches, and wherein each gate trench of the first type forms an outer ring around one of the gate trenches of the second type so that an intermediary ring of the second doped region is interposed between the inner and outer trench rings.

21. The semiconductor device of claim 20, further comprising a contact for electrically contacting the intermediary ring of the second doped region.

22. A semiconductor device, comprising:

a plurality of field plate trenches formed in a semiconductor substrate;

a plurality of gate trenches formed in the semiconductor substrate and spaced apart from the field plate trenches; and a plurality of device cells having a cell pitch defined by a distance from one side of a field plate trench to the same side of an adjacent field plate trench, each device cell comprising a first doped region of a first conductivity type and a second doped region of a second conductivity type adjacent the first doped region in a part of the semiconductor substrate disposed between the adjacent field plate trenches that define the cell pitch, wherein at least some of the device cells have more than one gate trench per cell pitch, wherein the field plate trenches have an extension in every direction in parallel to a first main surface of the semiconductor substrate, which is smaller than a maximum extension in a direction perpendicular to the first main surface, wherein the first doped region of the device cells is a transistor source region, wherein the second doped region of the device cells is a transistor body region, and wherein the body region of the device cells that have more than one gate trench per cell pitch is electrically contacted within the device cells only through a field plate in the field plate trenches.

23. A semiconductor device, comprising:

a plurality of field plate trenches formed in a semiconductor substrate;

a plurality of gate trenches formed in the semiconductor substrate and spaced apart from the field plate trenches; and a plurality of device cells having a cell pitch defined by a distance from one side of a field plate trench to the same side of an adjacent field plate trench, each device cell comprising a first doped region of a first conductivity type and a second doped region of a second conductivity type adjacent the first doped region in a part of the semiconductor substrate disposed between the adjacent field plate trenches that define the cell pitch, wherein at least some of the device cells have more than one gate trench per cell pitch, wherein the field plate trenches have an extension in every direction in parallel to a first main surface of the semiconductor substrate, which is smaller than a maximum extension in a direction perpendicular to the first main surface, wherein at least two of the gate trenches of the device cells that have more than one gate trench per cell pitch intersect within the same device cell.

24. The semiconductor device of claim 23, wherein a portion of the second doped region is segmented into islands by the intersecting gate trenches, and wherein the device cells that have more than one gate trench per cell pitch further comprise a contact for electrically contacting the islands of the second doped region.

25. A semiconductor device, comprising:

a plurality of field plate trenches formed in a semiconductor substrate;

a plurality of gate trenches formed in the semiconductor substrate and spaced apart from the field plate trenches; and a plurality of device cells having a cell pitch defined by a distance from one side of a field plate trench to the same side of an adjacent field plate trench, each device cell comprising a first doped region of a first conductivity type and a second doped region of a second conductivity type adjacent the first doped region in a part of the semiconductor substrate disposed between the adjacent field plate trenches that define the cell pitch, wherein at least some of the device cells have more than one gate trench per cell pitch, wherein the field plate trenches have an extension in every direction in parallel to a first main surface of the semiconductor substrate, which is smaller than a maximum extension in a direction perpendicular to the first main surface, wherein the gate trenches of the device cells that have more than one gate trench per cell pitch are non-intersecting within the same device cell so that the second doped region extends continuously within each device cell to the end of the device cell without interruption by the gate trenches, wherein the second doped region of the device cells that have more than one gate trench per cell pitch is electrically contacted within the device cells only through a field plate in the field plate trenches.

26. A semiconductor device, comprising:

a plurality of field plate trenches formed in a semiconductor substrate;

a plurality of gate trenches formed in the semiconductor substrate and spaced apart from the field plate trenches; and a plurality of device cells having a cell pitch defined by a distance from one side of a field plate trench to the same side of an adjacent field plate trench, each device cell comprising a first doped region of a first conductivity type and a second doped region of a second conductivity type adjacent the first doped region in a part of the semiconductor substrate disposed between the adjacent field plate trenches that define the cell pitch, wherein at least some of the device cells have more than one gate trench per cell pitch, wherein the field plate trenches have an extension in every direction in parallel to a first main surface of the semiconductor substrate, which is smaller than a maximum extension in a direction perpendicular to the first main surface, wherein at least some of the device cells that have more than one gate trench per cell pitch include a first type of gate trench and a second type of gate trench, wherein the first type of gate trench comprises a gate conductor disposed in a gate trench and electrically insulated from the first and second doped regions of the device cell, and wherein the second type of gate trench comprises a gate conductor disposed in a gate trench and electrically connected to the first and second doped regions of the device cell, wherein the gate trenches of the first type have a different geometry than the gate trenches of the second type within the same device cell.

* * * * *